(12) United States Patent
Kamgaing et al.

(10) Patent No.: US 9,773,742 B2
(45) Date of Patent: Sep. 26, 2017

(54) EMBEDDED MILLIMETER-WAVE PHASED ARRAY MODULE

(71) Applicant: Intel Corporation, Santa Clara, CA (US)

(72) Inventors: Telesphor Kamgaing, Chandler, AZ (US); Adel Elsherbini, Chandler, AZ (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 733 days.

(21) Appl. No.: 14/132,729

(22) Filed: Dec. 18, 2013

(65) Prior Publication Data

US 2015/0325925 A1    Nov. 12, 2015

(51) Int. Cl.
| | |
|---|---|
| H01Q 21/06 | (2006.01) |
| H01Q 1/38 | (2006.01) |
| H01L 23/66 | (2006.01) |
| H01Q 21/00 | (2006.01) |
| H01L 21/48 | (2006.01) |

(Continued)

(52) U.S. Cl.
CPC .......... *H01L 23/66* (2013.01); *H01L 21/4853* (2013.01); *H01L 21/52* (2013.01); *H01L 23/49816* (2013.01); *H01L 23/49827* (2013.01); *H01L 23/49838* (2013.01); *H01L 24/19* (2013.01); *H01L 24/20* (2013.01); *H01Q 1/2283* (2013.01); *H01Q 1/38* (2013.01); *H01Q 21/0006* (2013.01); *H01Q 21/0093* (2013.01); *H01Q 23/00* (2013.01); *H01L 2223/6622* (2013.01); *H01L 2223/6677* (2013.01); *H01L 2223/6683* (2013.01); *H01L 2224/04105* (2013.01); *H01L 2224/12105* (2013.01); *H01L 2224/73267* (2013.01); *H01L 2924/15311* (2013.01); *H01L 2924/15313* (2013.01); *H01L 2924/18162* (2013.01)

(58) Field of Classification Search
CPC ............ H01L 2223/6677; H01L 23/66; H01Q 1/2283; H01Q 1/38; H01Q 21/065
USPC ........................................................ 333/247
See application file for complete search history.

(56) References Cited

U.S. PATENT DOCUMENTS 7,515,435 B2 * 4/2009 Jow .......................... H01G 4/30
                                                                    174/250
7,579,251 B2 * 8/2009 Imanaka ............. H01L 21/4857
                                                                   257/E21.004

(Continued)

FOREIGN PATENT DOCUMENTS

| CN | 101625730 A | 1/2010 |
|---|---|---|
| CN | 101944653 A | 1/2011 |

*Primary Examiner* — Dean Takaoka
*Assistant Examiner* — Alan Wong
(74) *Attorney, Agent, or Firm* — Schwegman Lundberg & Woessner, P.A.

(57) ABSTRACT

Embodiments of an embedded mm-wave radio integrated circuit into a substrate of a phased array module are disclosed. In some embodiments, the phased array module includes a first set of substrate layers made of a first material. The mm-wave radio integrated circuit may be embedded in the first set of substrate layers. A second set of substrate layers may be coupled to the first set of substrate layers. The second set of substrate layers may be made of a second material that has a lower electrical loss than the first material. The second set of substrate layers may include a plurality of antenna elements coupled through vias to the mm-wave radio integrated circuit.

15 Claims, 11 Drawing Sheets

(51) Int. Cl.
*H01L 23/498* (2006.01)
*H01L 21/52* (2006.01)
*H01Q 1/22* (2006.01)
*H01Q 23/00* (2006.01)
*H01L 23/00* (2006.01)

(56) References Cited

U.S. PATENT DOCUMENTS

| | | | | |
|---|---|---|---|---|
| 7,646,344 B2* | 1/2010 | Liu | ............... | H01Q 9/0457 |
| | | | | 343/700 MS |
| 8,502,339 B2* | 8/2013 | Lin | ............... | H01L 21/6835 |
| | | | | 257/532 |
| 8,648,454 B2* | 2/2014 | Liu | ............... | H01L 23/66 |
| | | | | 257/684 |
| 9,153,863 B2* | 10/2015 | Nair | ............... | H01Q 1/38 |
| 2009/0322643 A1 | 12/2009 | Choudhury | | |
| 2011/0014878 A1 | 1/2011 | Choudhury et al. | | |
| 2013/0207274 A1 | 8/2013 | Liu et al. | | |
| 2014/0008773 A1* | 1/2014 | Yen | ............... | H01Q 1/38 |
| | | | | 257/664 |
| 2014/0063754 A1* | 3/2014 | Junemann | ............... | H01Q 1/38 |
| | | | | 361/736 |

\* cited by examiner

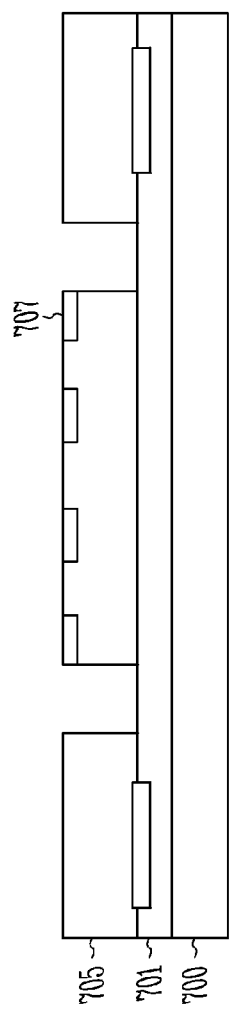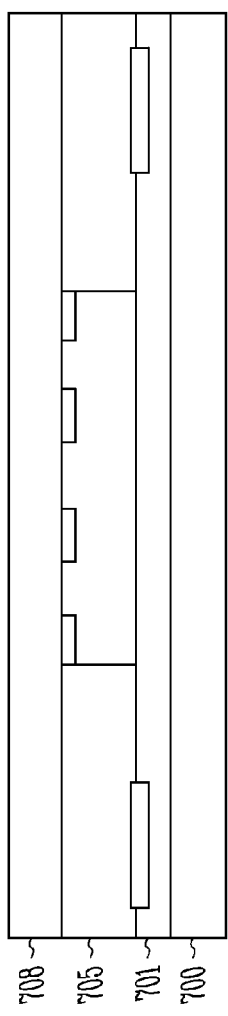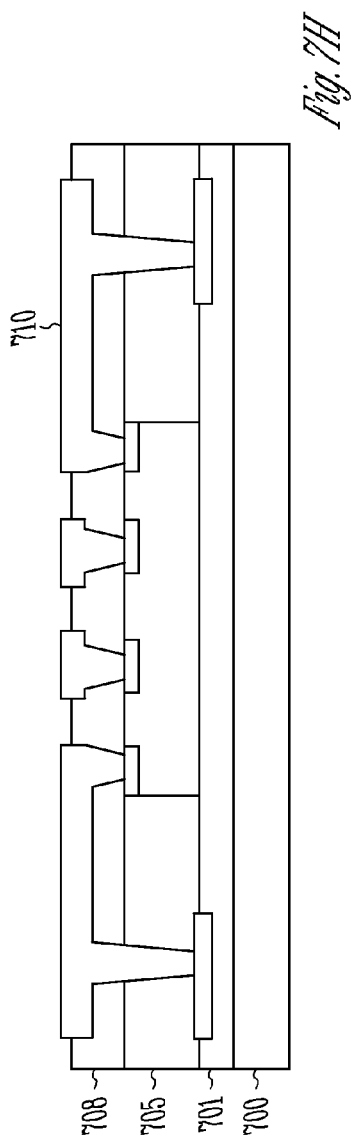

EMBEDDED MILLIMETER-WAVE PHASED ARRAY MODULE

TECHNICAL FIELD

Embodiments described herein generally relate to integrated circuits. Some embodiments relate to embedded millimeter-wave phased array modules.

BACKGROUND

Due to an increasingly crowded frequency spectrum, electronic device manufacturers have relatively recently become interested in the integration of radios capable of frequencies of 60 GHz and above. Millimeter-wave (mm-wave) radios integrated into electronic devices may provide short range, high-speed transfer of data with data rate in the order of several Gigabits per seconds (Gbps).

One problem with attaching mm-wave radio dies to stacks of substrate materials is that the mm-wave dielectric material used in the substrate can be relatively expensive as compared to other materials, hence limiting the mass-adoption of such radios in consumer electronics. Additionally, traditional substrate materials can exhibit poor electrical performance (e.g., electrically lossy) at mm-wave frequencies as compared to other types of dielectric materials.

There are general needs for adding mm-wave radio dies to a stack of substrates.

BRIEF DESCRIPTION OF THE DRAWINGS

FIGS. 7A-7K illustrate a flow process for fabricating an embedded mm-wave phased array module using a bumpless build-up layer-coreless process.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Subsequent discussions refer to integrated circuits. The term integrated circuit may refer to not only the electrical circuitry but also any die, film, substrate (e.g., silicon), and/or other material used to mount the circuitry. Thus, as used herein, an integrated circuit may include an electrical circuit formed on or as part of the die, substrate, the film, and/or any other material for mounting circuitry. The substrate may also be part of the integrated circuit.

Subsequent discussions also refer to upper and lower sets of substrates. These are only labels used for purposes of illustration and reference and do not imply any required orientation of the different substrates or sets of substrates. For example, one skilled in the art would realize that the illustrated embodiments may be shown upside down from an actual fabrication orientation.

Figure 1:
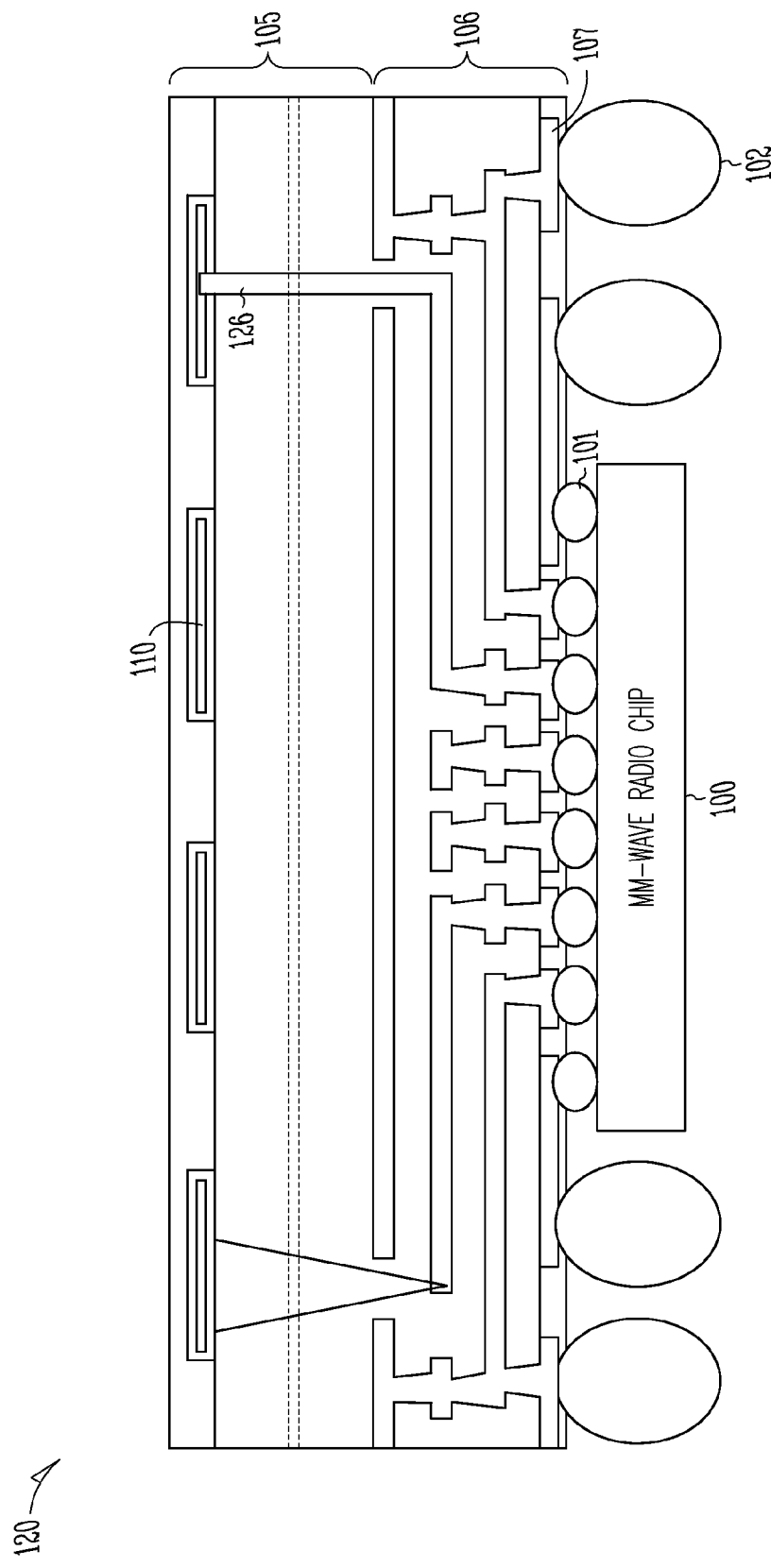
FIG. 1 illustrates a cross-sectional view of a typical prior art embodiment of a millimeter-wave phased array module using a flip-chip substrate technology.

FIG. 1 illustrates a cross-sectional view of a typical prior art mm-wave radio integrated circuit 100 attached to an integrated circuit package 120. The integrated circuit package 120 may include antenna layers 105 and routing layers 106.

The antenna layers 105 may include a plurality of antenna elements 110 along a top surface of the package 120. The antenna elements 110 may be coupled to the routing layers 106 through vias 126 and/or metal traces.

The routing layers 106 may include the circuitry to implement the function of the integrated circuit package 120. The routing layers 106 may include multiple layers of metal traces and circuits to implement this function. The routing layers 106 may also have a plurality of pads 107 that may be coupled to solder balls or bumps 101, 102.

The solder balls 101, 102 may be used to connect the integrated circuit package 120 to other substrates (not shown). For example, the larger solder balls 102 may be used to connect the circuitry on the routing layers 106 to circuitry on other substrates. The smaller solder balls 101 may be used to connect the circuitry on the routing layers 106 to the mm-wave radio integrated circuit 100. Thus, the mm-wave radio integrated circuit 100 may be attached to the surface of the integrated circuit package 120. Such radios may be used for wireless docking applications, post silicon validation, rapid synchronization and downloading as well as wireless transmission of uncompressed high definition (HD) video.

One problem with the package design of FIG. 1 is that the entire package 120 may use the same mm-wave dielectric materials (e.g., low temperature co-fired ceramic (LTCC), liquid crystal polymer (LCP)) to minimize the routing losses and improve antenna efficiency. These materials may be relatively expensive as compared to other materials. The high cost associated with such a stack may be a limiting factor for the adoption of mm-wave phased array devices in low cost consumer electronics. One problem associated with using flip-chip (FC) die with solder balls is that the balls expand during reflow and can lead to solder bridging that may cause electrical shorts. In the embedded die technology, vias are used as first level interconnect, hence it's possible to design with finer pitch and provide some level of scalability with different technology generations.

Figure 2:
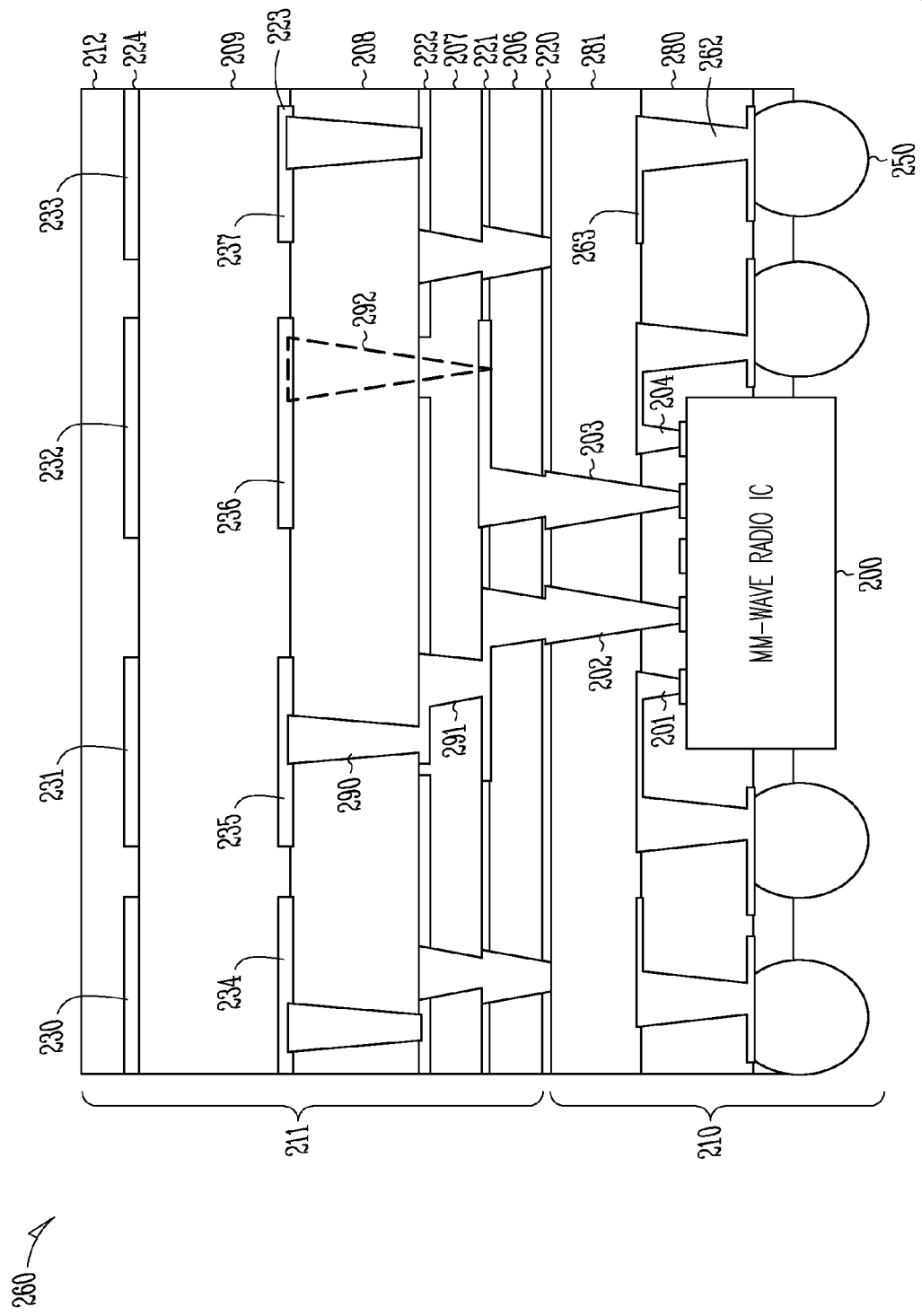
FIG. 2 illustrates a cross-sectional view of an embodiment of a mm-wave phased array module using embedded die technology.

As shown in FIG. 2, a signal generating/receiving circuit (e.g., mm-wave radio integrated circuit) 200 may be embedded (e.g., mounted internally) into one of a set of lower substrate layers 210 of a substrate stack of an electronic device for generating or receiving signals (e.g., phased array module) 260. By embedding the mm-wave radio integrated circuit 200 into the lower substrate layers 210 instead of surface mounting, different materials may be used in the substrate stack of the phased array module 260. Thus, the lower substrate layers 210 may include standard packaging substrate material while only the upper substrate layers 211 may include the more expensive mm-wave substrate materials that exhibit lower electrical losses as compared to the materials of the lower substrate layers 210.

For example, the routing traces of the upper substrate layers 211 (e.g., mm-wave substrate materials) may exhibit losses of approximately 0.5-2 dB/cm while the routing traces of the lower substrate layers 210 (e.g., standard packaging substrate material) may exhibit losses of approximately 8 dB/cm around 60 GHz. This may reduce costs and improve the electrical performance (e.g., approximately 20% increase in antenna efficiency) as compared to mounting the mm-wave radio integrated circuit 200 on the substrate surface and using only the mm-wave substrate material for the entire module.

FIG. 2 illustrates a cross-sectional view of an embodiment of the embedded mm-wave radio integrated circuit 200 in the phased array module 260. The illustrated embodiment may use embedded die technology to embed the mm-wave radio integrated circuit 200 into the lower substrate layers 210 of the substrate stack of the phased array module 260. The die may be attached to the substrate stack using bumpless build-up layer technologies.

As an example, the embedded die technology may include fabricating the mm-wave radio integrated circuit 200 including formation of pad expansions and bond pads. The lower substrate layers 210 may be formed including the vias 201-204 to be bonded to the mm-wave radio integrated circuit 200. The radio integrated circuit 200 may then be embedded into the lower substrate layers 210 by molding or encapsulation. This example of embedded die technology is for purposes of illustration only. Other embedding technologies may be used. The embedded die technology may thus enable the mm-wave radio integrated circuit 200 to be internally coupled to the phased array module 260 through plated vias instead of surface mounting. This may enable a finer pitch to be used between vias and interconnects.

The lower substrate layers 210 may be made of a standard packaging substrate material. For example, the lower substrate layers 210 may be made of Ajinomoto Build-up Film (ABF), an epoxy dielectric material, or some other type of similar material. The materials disclosed for the lower substrate layers 210 are for purposes of illustration only.

The lower substrate layers 210 may include all of the low frequency signal traces and power delivery network for the substrate stack of the phased array module 260. The vias and traces of the lower substrate layers 210 may be connected to second level interconnects, such as ball grid arrays (BGA) and/or land grid arrays (LGA) of the upper substrate layers 211, as will be discussed subsequently with reference to FIG. 3.

The lower substrate layers 210 may include the metal routing traces, the vias, and/or the micro-vias used to connect one layer of the substrate stack of the phased array module 260 with another layer of the substrate stack of the phased array module 260. For example, the lower substrate layers 210 may include layers 280, 281.

Solder balls 250 may be coupled to solder ball pads that are coupled to or part of traces and/or circuitry through vias 262. For example, low frequency signal and/or power supply layer 263, within the lower substrate layers 210, may be coupled through vias 262 to the solder balls 250. The solder balls 250 may be used to couple the phased array module 260 to other substrates/circuitry.

Similarly, the embedded mm-wave radio integrated circuit 200 may be coupled through a plurality of vias 201-204 to a routing trace layer 221 that may be located within the upper substrate layers 211. The routing trace layer 221 may be used to route high frequency signals within the upper substrate layers 211. For example, the routing trace layer 221 may be used to route signals from vias 202, 203 coupled to the mm-wave radio integrated circuit 200 to vias 290-292 coupled to the antenna elements 234-236. The multiple antenna elements 230-236 may form a phased array antenna. Vias 202, 203 may also route power and low frequency signals from the low frequency signal and/or power supply layer 263 to the mm-wave radio integrated circuit 200.

The upper substrate layers 211 may be made of relatively low-loss mm-wave substrate material. For example, the upper substrate layers 211 may be liquid crystal polymer (LCP) or a composite thereof or low temperature co-fired ceramic (LTCC) or glass. The materials disclosed for the upper substrate layers 211 are for purposes of illustration only.

The upper substrate layers 211 may include high frequency signals, as compared to the signals of the lower substrate layers 210. For example, the upper substrate layers 211 may include the mm-wave phased array antenna elements 230-237 as formed in layers 223, 224. These antenna elements 230-237 together may form a phased array antenna.

The upper substrate layers 211 may further include ground planes 220, 222 on either side of the routing trace layer 221. The ground planes 220, 222 may be used as shielding to reduce high frequency noise from the routing trace layer 221. Substrate layers 206, 207 may separate the ground planes 220, 222 from the routing trace layer 221. Other embodiments may use only a single ground plane or the ground plane may be part of the routing trace layer 221.

The antenna elements 230-237 may be implemented on one, two or more layers 223, 224 of the upper substrate layers 211. These layers 223, 224 may be separated by a substrate layer 209. A top layer 212 of a cover film may be formed over the top antenna layer 224. The cover film may be a millimeter wave material as well.

In the embodiment of FIG. 2 as well as subsequently described embodiments, the upper layer of antenna elements 224 may not be electrically connected to any lower circuits or vias. The upper layer of antenna elements 224 may be capacitively coupled to the lower layer of antenna elements 223. Thus, any signal transmitted from the lower layer of antenna elements 223 may excite the upper layer of antenna elements 224 into transmission as well.

The capacitively coupled antenna elements may be vertically aligned. As such, antenna element 230 may be coupled with antenna element 234 to form a single broadband antenna unit cell. Similarly, the other antenna elements may be capacitively coupled to form antenna unit cells 231-235, 232-236 and 233-237. The combination of those antenna unit cells may form the phased array antenna whose operation is controlled by the die. The combination of the die, the phased array antenna, and rest of the package may be referred to herein as the phased array module.

While the previously described embodiments refer to a single die mm-wave radio integrated circuit, other embodiments may use two or more different dies (e.g., radio frequency integrated circuit (RFIC) and baseband). Such embodiments may be implemented as stacked or side-by-side dies since the size of the module 260 may be defined by the antenna array that may be larger than a typical RFIC die.

The embedding of the mm-wave radio integrated circuit 200 in the phased array module 260 enables the use of vias in the phased antenna array module 260. The use of the vias 201-204 as the first level interconnects may enable scalability of the phase antenna array module 260 with reduced signal congestion at the first level interconnect. The use of vias may enable a finer pitch to be used that may enable a smaller package or smaller die since, in most phased arrays, the antenna arrangement may define the size of the package which is likely larger than the die. Additionally, if the same pitch is used, smaller traces between vias and pins may be used to reduce noise in the package.

The embedding of the mm-wave radio integrated circuit 200 may also provide for an asymmetric substrate layer stack that enables the creation of thicker dielectric layers, used for the antenna elements, without increasing the package layer count (i.e., cost reduction in comparison to traditional packages).

Figure 3:
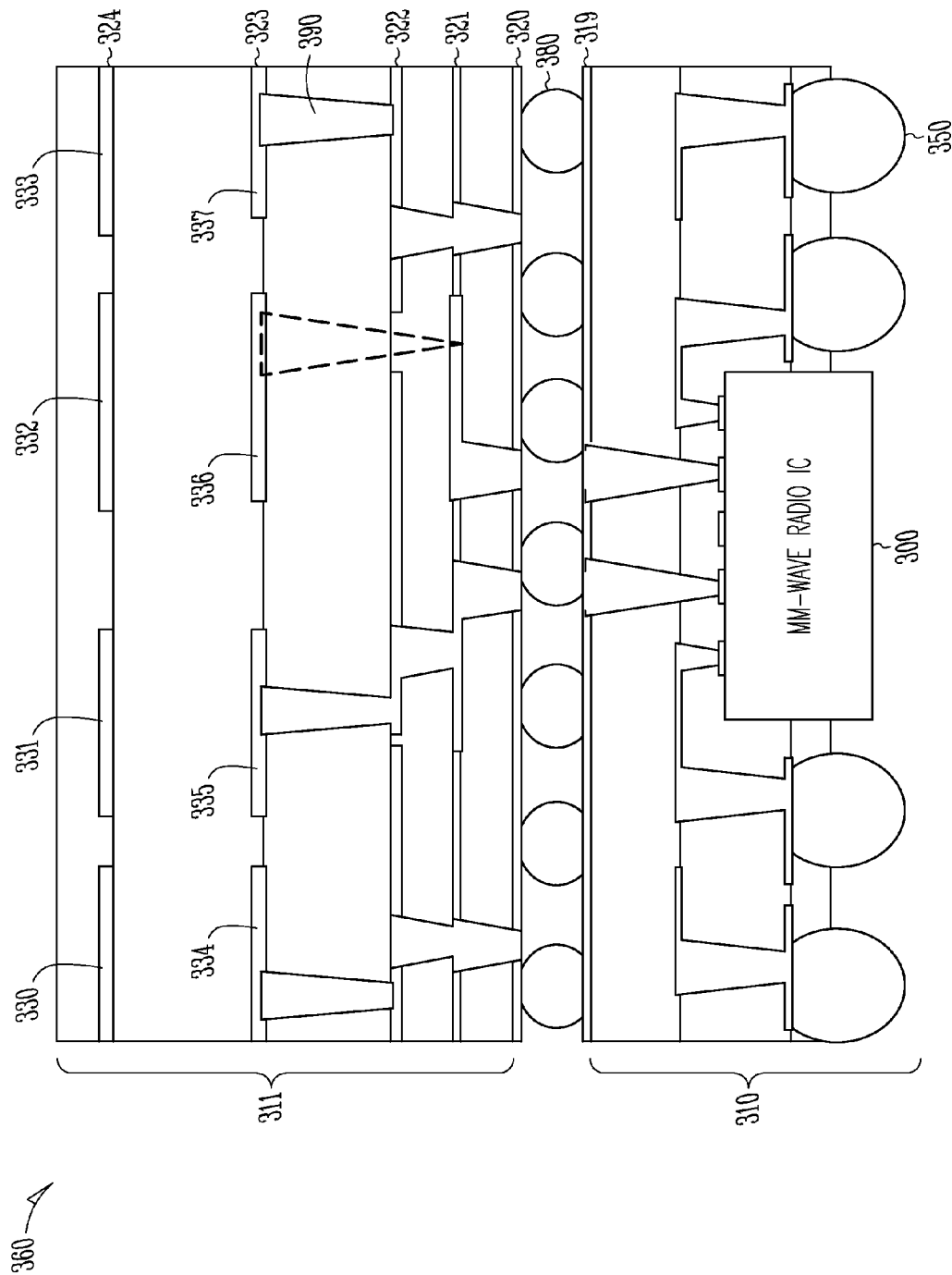
FIG. 3 illustrates a cross-sectional view of another embodiment of the mm-wave phased array module using embedded die technology.

FIG. 3 illustrates a cross-sectional view of another embodiment of the embedded mm-wave radio integrated circuit 300 in the phased array module 360. The mm-wave radio integrated circuit 300 may be embedded into the phased array module 360 as discussed previously but the illustrated embodiment may use separate, stacked packages.

As in previous embodiments, the phased array module may include lower substrate layers 310 and upper substrate layers 311. The lower substrate layers 310 may include circuitry for low frequency signals and power delivery network while the upper substrate layers 311 may include layers for the higher frequency signals. The upper substrate layers 311 may also include the phased array antenna elements in rows 323, 324. The composition of the two sets of layers 310, 311 may be substantially similar to those discussed previously.

In the embodiment of FIG. 3, rows of solder balls 380 may be located between the lower substrate layers 310 and the upper substrate layers 311. The row of solder balls 380 may both electrically and physically couple the lower substrate layers 310 to the upper substrate layers 311. For example, a top layer 319 of the lower substrate layers 310 may include solder pads to which the solder balls 380 may be coupled. Similarly, a bottom layer 320 of the upper substrate layers 311 may also include solder pads to which the solder balls 380 may be coupled. The row of solder balls 380 may comprise BGA or LGA interconnects. Direct metal to metal bonding may also be used to connect the 2 packages.

The bottom layer 320 may also include a ground plane 320 and the solder pads may be interspersed on the ground plane 320. Thus, the ground plane 320 and an upper ground plane 322 may provide shielding for the routing trace layer 321 that may route the high frequency signals from the mm-wave radio integrated circuit 300 to vias 390 for coupling to antenna elements 330-336.

As in the previous embodiment, the lower substrate layers 310 may comprise ABF or some other type of similar material. The upper substrate layers 311 may comprise the high frequency material such as LCP, LTCC or some other similar material.

Figure 4:
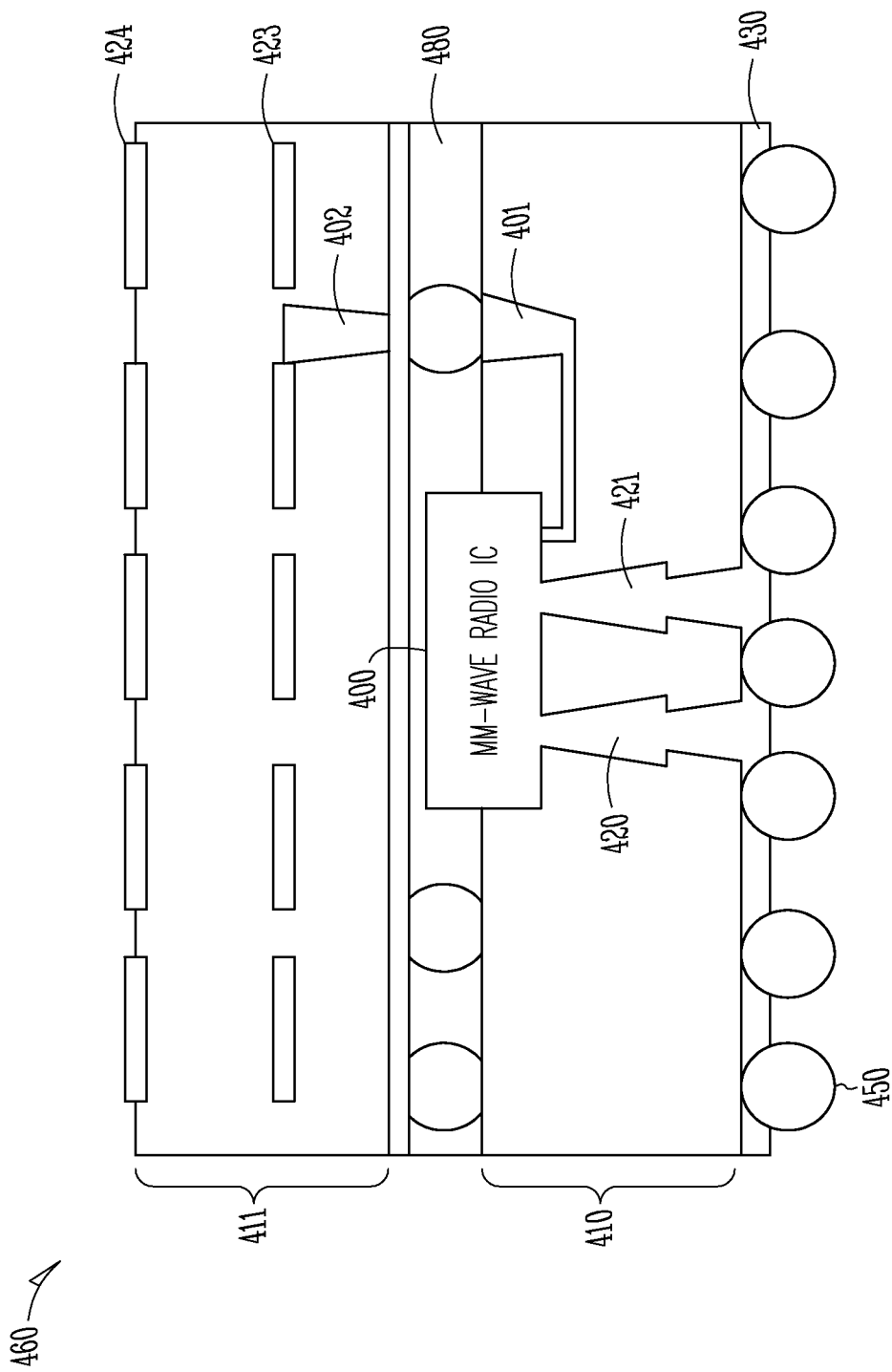
FIG. 4 illustrates a cross-sectional view of another embodiment of the mm-wave phased array module using embedded die technology.

FIG. 4 illustrates a cross-sectional view of another embodiment of the embedded mm-wave radio integrated circuit 400 in the phased array module 460. In this embodiment, the mm-wave radio integrated circuit 400 may be embedded in the middle of the phased array module 460.

The mm-wave radio integrated circuit 400 may be embedded in the lower substrate layers 410 as discussed previously. The upper substrate layers 411 may then be coupled to the lower substrate layers 410 through a row of solder balls 480.

Vias 420, 421 may be used to couple the mm-wave radio integrated circuit 400 to a lower connections layer 430 of the lower substrate layers 410. The lower connections layer 430 may comprise solder ball pads that may accept a row of solder balls 450 for coupling the phased array module 460 to other circuitry and/or substrates.

Vias 401, 402 may be used to couple the mm-wave radio integrated circuit 400 to antenna elements in phased array antenna element rows 423, 424. For example, via 401 may couple the mm-wave radio integrated circuit 400 to the middle row of solder balls 480. Via 402 may then couple the middle row of solder balls 480 to the rows of antenna elements 423, 424.

As in previous embodiments, the lower substrate layers 410 may comprise ABF or some other type of similar material. The upper substrate layers 411 may comprise the high frequency material such as LCP, LTCC or some other similar material.

Figure 5:
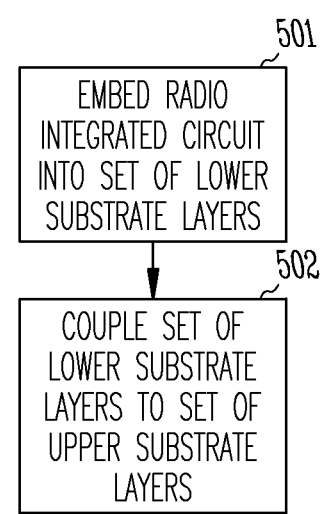
FIG. 5 illustrates a flowchart of an embodiment of a method for fabricating a mm-wave phased array module using embedded die technology.

FIG. 5 illustrates a flowchart of an embodiment of a method for fabricating an embedded mm-wave phased array module. The method may embed the mm-wave radio integrated circuit into the set of lower substrate layers 501. This may be accomplished as discussed previously. The mm-wave radio integrated circuit may be embedded in the same substrate as the solder balls used to couple the phased array module to other circuitry. The mm-wave radio integrated circuit may be embedded in a substrate between the set of lower substrate layers and the set of upper substrate layers.

The set of lower substrate layers may be coupled to the set of upper substrate layers for form the module 502. This may be accomplished by direct connection of the two sets of layers, having a ground plane between the two sets of layers, or using a row of solder balls to connect the two sets of layers.

Figure 6:
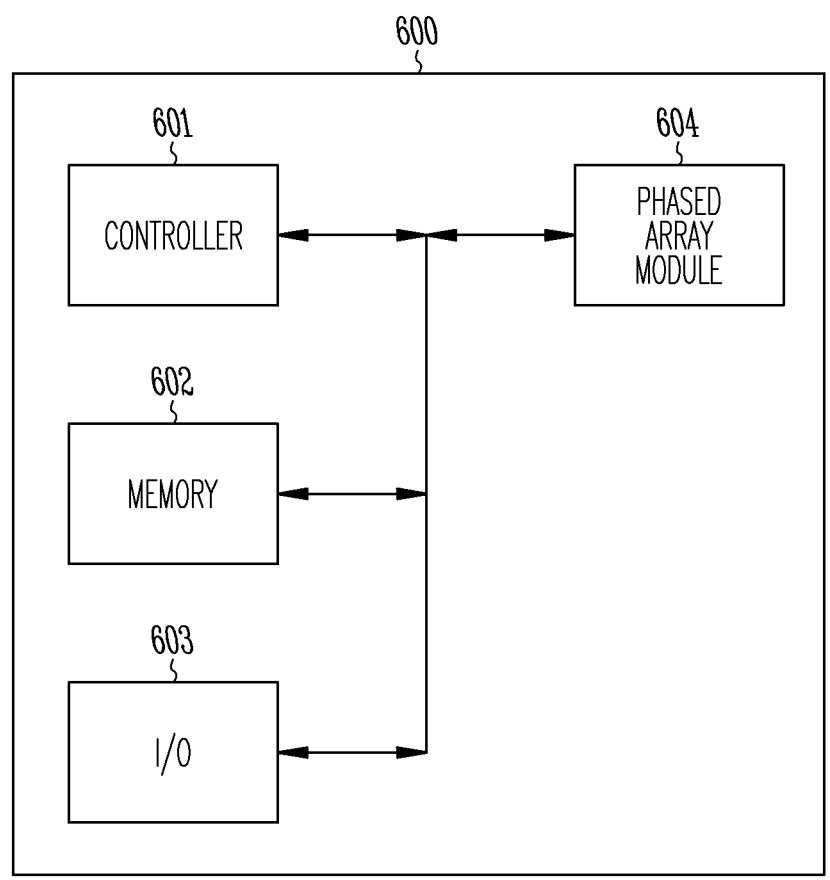
FIG. 6 illustrates a block diagram of a system using the phased array module.

FIG. 6 illustrates a block diagram of a system that may use the phased array module. The system may include a computer (e.g., desktop, laptop, netbook, notebook, tablet) or some other electronic device that may use radio communication (e.g. cell phone, wearable device).

The system may include a controller 601 for controlling operation of the system. Memory 602 can be coupled to the controller 601 and temporarily and/or permanently store data for use in the system. The memory 602 may include volatile memory such as random access memory (RAM) or non-volatile memory such as read only memory (ROM), Flash memory, and/or phase change memory. Input/output (I/O) 603 may include some means for inputting data as well as displaying data. For example, I/O 603 may include a keyboard, keypad, touchscreen, monitor, and/or some type of LCD/LED display.

The phased array module 604 may be coupled to the controller 601, memory 602, and/or I/O 603, over a bus, to be used for generating and/or receiving signals for use by the system. The controller 601 may write data to the phased array module 604 for transmission as a radio signal to another electronic device. The phased array module 604 may also receive signals from other electronic devices and relay those signals as data to the controller 601.

FIGS. 7A-7K illustrate an embodiment of a flow process for fabricating an embedded mm-wave phased array module in a bump-less build-up layer-coreless (BBUL-C) process. These figures are for purposes of illustration only as there may be multiple fabrication methods to produce a mm-wavev phased array module.

Figure 7A:
Figure 7B:
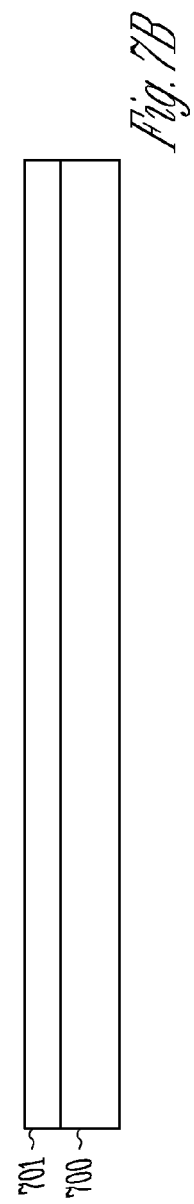
Figure 7C:
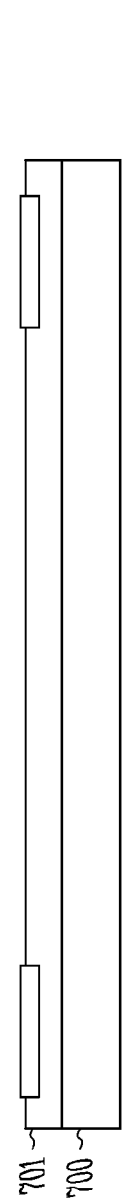
Figure 7D:
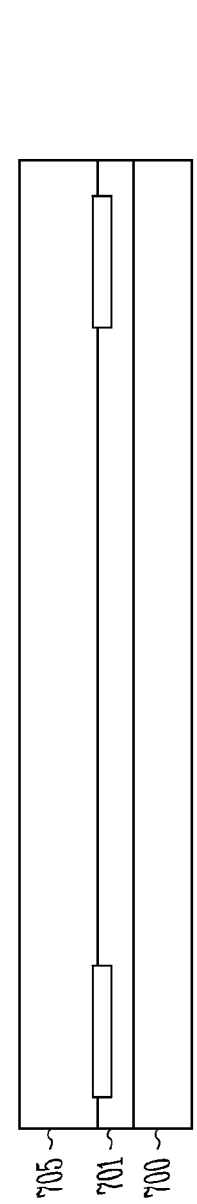

FIG. 7A shows the carrier 700 upon which the process is formed. FIG. 7B shows a dissolvable adhesive film 701 being attached. FIG. 7C shows ball grid array pads 703, 704 being formed on the adhesive film 701. FIG. 7D shows the first build-up layer 705 being attached to the adhesive film 701.

Figure 7E:
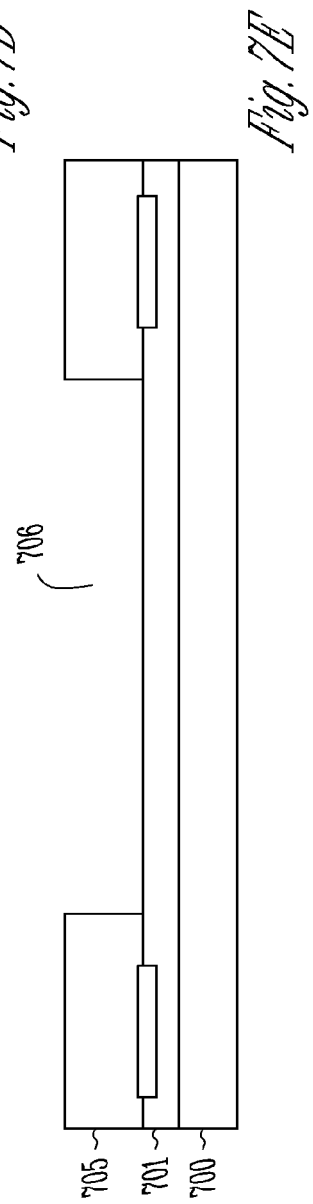

FIG. 7E shows a cavity 706 being created in the first build-up layer 705 in order to accept the mm-wave radio integrated circuit 707. FIG. 7F shows the mm-wave radio integrated circuit die 707 being mounted in the cavity 706. FIG. 7G shows that the cavity may be filled and a build-up layer dielectric 708 laminated on top of the first build-up layer 705.

Figure 7I:
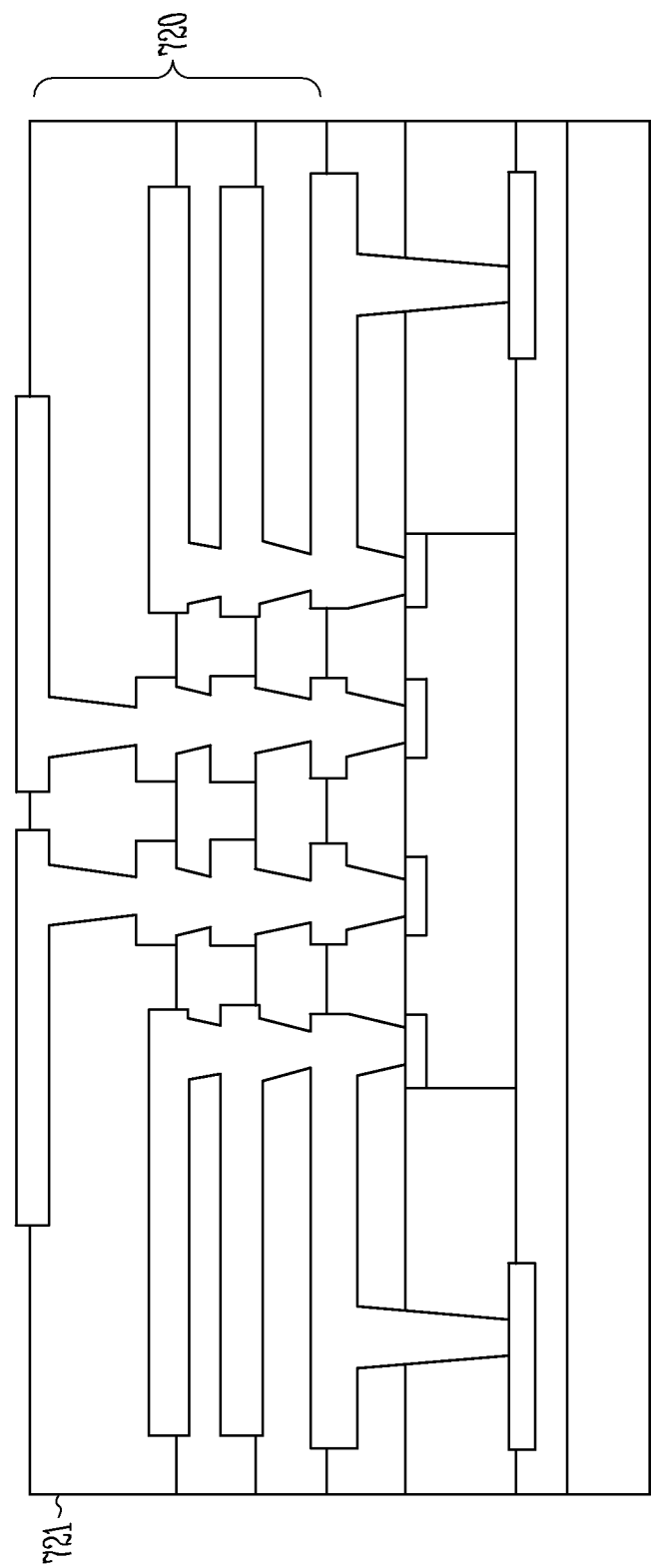

FIG. 7H shows a metal layer 710 being formed with plated vias. FIG. 7I shows that the process steps of FIGS. 7F and 7G are repeated as needed in order to add additional build-up layers of mm-wave material and traces 720. This is performed up to and including the first antenna layer 721.

Figure 7J:
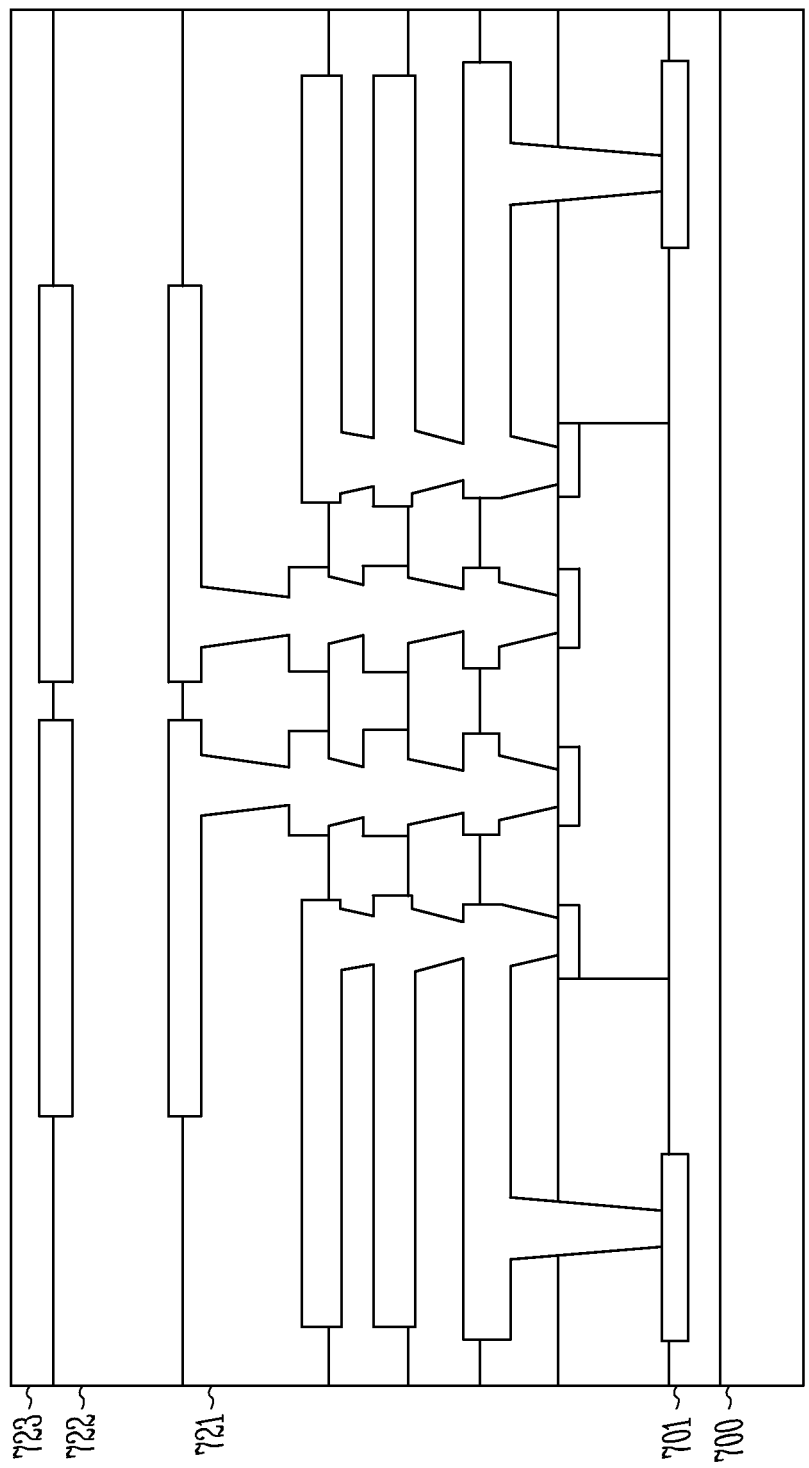
Figure 7K:
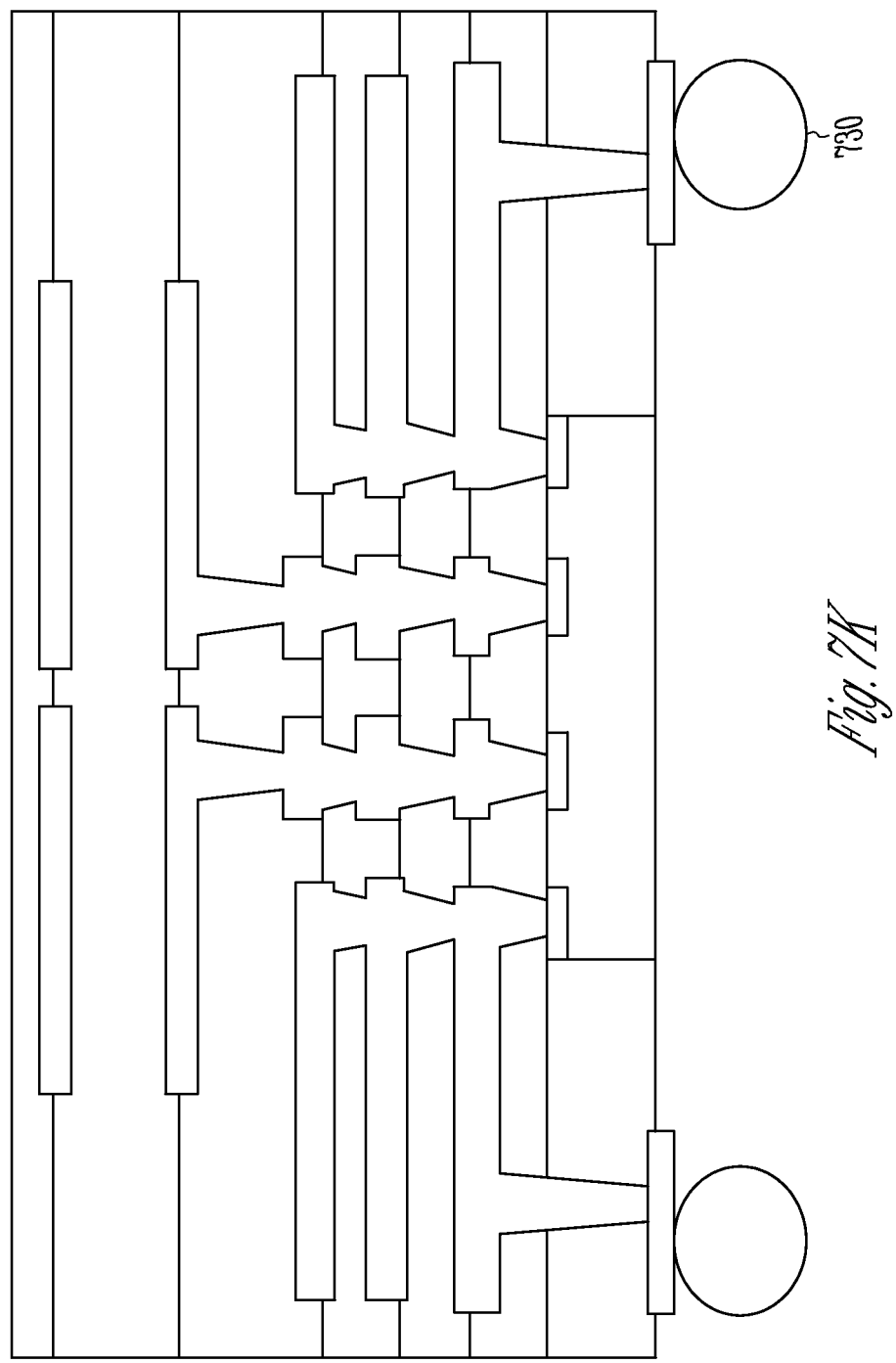

FIG. 7J shows the top antenna layer 722 and cover film 723 being formed over the first antenna layer 721 using mm-wave material. Note that there are no vias used between antenna layers. FIG. 7K shows that the module may be separated from the carrier 700 and adhesive film 701 and then may be attached to the BGA 730.

In the above embodiments, the package substrate may be a coreless or a thin core substrate. The die may be attached to the package using a BBUL process or a BBUL-C process to fabricate the phased array module. In this case, metal vias may be used to connect the die to the substrate. No solder balls may be used at that interface.

EXAMPLES

The following examples pertain to further embodiments.

Example 1 is a phased array module comprising: a first set of substrate layers comprising a first material; a radio integrated circuit embedded in the first set of substrate layers; and a second set of substrate layers coupled to the first set of substrate layers, the second set of substrate layers comprising a second material having a lower electrical loss than the first material, the second set of substrate layers further comprising a plurality of antenna elements coupled through vias to the radio integrated circuit.

In Example 2, the subject matter of Example 1 can optionally include wherein the first material comprises one of an Ajinomoto Build-up Film (ABF) or an epoxy dielectric material.

In Example 3, the subject matter of Examples 1-2 can optionally include wherein the second material comprises one of a liquid crystal polymer (LCP) or low temperature co-fired ceramic (LTCC).

In Example 4, the subject matter of Examples 1-3 can optionally include wherein only the second set of substrate layers comprises mm-wave substrate material.

In Example 5, the subject matter of Examples 1-4 can optionally include wherein the radio integrated circuit comprises a millimeter-wave radio integrated circuit.

In Example 6, the subject matter of Examples 1-5 can optionally include wherein the radio integrated circuit comprises two or more separate dies.

In Example 7, the subject matter of Examples 1-6 can optionally include wherein the two or more separate dies comprise a radio frequency integrated circuit and a baseband integrated circuit.

In Example 8, the subject matter of Examples 1-7 can optionally include wherein the radio integrated circuit is internally coupled to a substrate layer of the first set of substrate layers.

In Example 9, the subject matter of Examples 1-8 can optionally include wherein the plurality of antenna elements comprise: a first layer of antenna elements coupled to the radio integrated circuit through the vias; and a second layer of antenna elements separated from the first layer by a substrate layer and capacitively coupled to the first layer of antenna elements.

In Example 10, the subject matter of Examples 1-9 can optionally include wherein the first set of substrate layers is coupled to the second set of substrate layers with a ground plane.

Example 11 is a phased array module comprising: a set of lower substrate layers comprising a plurality of substrates of a first material, each substrate separated from an adjacent substrate by a low frequency signal layer and/or power supply layer; a radio integrated circuit embedded in a first substrate of the set of lower substrate layers and coupled to the low frequency signal layer and/or the power supply layer through a plurality of vias; a set of upper substrate layers coupled to the set of lower substrate layers, the set of upper substrate layers comprising a plurality of substrates of a second material having a lower electrical loss than the first material, each substrate separated from an adjacent substrate by a high frequency signal layer for conducting signals having a higher frequency than the lower frequency signal layer; and a plurality of layers of antenna elements coupled to the set of upper substrate layers, at least one layer of antenna elements operably coupled to the radio integrated circuit through a plurality of vias.

In Example 12, the subject matter of Example 11 can optionally include wherein the set of lower substrate layers is separated from the set of upper substrate layers by a ground plane.

In Example 13, the subject matter of Examples 11-12 can optionally include wherein the first substrate is located adjacent to the set of upper substrate layers.

In Example 14, the subject matter of Examples 11-13 can optionally include wherein the set of lower substrate layers is coupled to the set of upper substrate layers by a row of solder balls and the radio integrated circuit is embedded into the first substrate layer adjacent to the row of solder balls.

Example 15 is a method for fabricating a phased array module, the method comprising: embedding a radio integrated circuit into a first set of substrates comprising a first material; and coupling a second set of substrates to the first set of substrates wherein the second set of substrates comprises a second material having a lower electrical loss than the first material, the second set of substrates comprising a plurality of antenna elements coupled to the radio integrated circuit through one or more vias.

In Example 16, the subject matter of Example 15 can optionally include wherein coupling the second set of substrates to the first set of substrates comprises a bumpless build-up layer process.

In Example 17, the subject matter of Examples 15-16 can optionally include wherein the radio integrated circuit is embedded into the first set of substrates in a substrate layer adjacent to the second set of substrates.

In Example 18, the subject matter of Examples 15-17 can optionally include coupling the second set of substrates to the first set of substrates with a first row of solder balls; coupling a second row of solder balls to the first set of substrates; and coupling the radio integrated circuit to the second row of substrates with a first set of vias.

In Example 19, the subject matter of Examples 15-18 can optionally include coupling the plurality of antenna elements to the radio integrated circuit through the one or more vias that are coupled to the first row of solder balls.

In Example 20, the subject matter of Examples 15-19 can optionally include wherein embedding the radio integrated circuit into the first set of substrates comprises: fabricating a mm-wave radio integrated circuit including forming pad expansions and bond pads; forming the first set of substrates with vias to be bonded to the mm-wave radio integrated circuit pad expansions and bond pads; and encapsulating the mm-wave radio integrated circuit into the first set of substrates.

Example 21 is a phased array module comprising: a first dielectric material comprising a packaging substrate material and at least one low frequency signal routing layer; a radio integrated circuit embedded in the first dielectric material; and a second dielectric material coupled to the first dielectric material, the second dielectric material having a lower electrical loss characteristic than the first material, the second dielectric material further comprising a plurality of layers of antenna elements coupled through vias to the radio integrated circuit.

In Example 22, the subject matter of Example 21 can optionally include wherein the first and second dielectric materials each comprise a plurality of routing layers configured to route signals wherein the plurality of routing layers of the second dielectric material route signals having higher frequencies than signals routed by the plurality of routing layers of the first dielectric material.

In Example 23, the subject matter of Examples 21-22 can optionally include wherein the first dielectric material comprises a standard packaging substrate material.

In Example 24, the subject matter of Examples 21-23 can optionally include wherein only the second dielectric material is mm-wave substrate material.

In Example 25, the subject matter of Examples 21-24 can optionally include wherein the first material exhibits an electrical loss of in a range of 1-2 dB/cm and the second material exhibits an electrical loss of approximately 8 dB/cm.

In Example 26, the subject matter of Examples 21-25 can optionally include wherein the radio integrated circuit is not connected to the first dielectric material with solder balls.

In Example 27, the subject matter of Examples 21-26 can optionally include wherein the first dielectric material comprises all of the low frequency signal routing traces and power delivery network of the phased array module.

Example 28 is a system for communicating with electronic devices, the system comprising: a controller for controlling the system; input/output, coupled to the controller, for enabling input of data to the system and output of data from the system; and a phased array module coupled to the controller and comprising: a first set of substrates comprising a first material; a radio integrated circuit embedded in the first set of substrates; and a second set of substrates coupled to the first set of substrates, the second set of substrates comprising a second material having a lower electrical loss than the first material, the second set of substrates further comprising a plurality of antenna elements coupled through vias to the signal generating/receiving circuit.

In Example 29, the subject matter of Example 28 can optionally include wherein the first material comprises one of an Ajinomoto Build-up Film (ABF) or an epoxy dielectric material and the second material comprises a mm-wave substrate material.

In Example 30, the subject matter of Examples 28-29 can optionally include wherein the first set of substrates is coreless.

In Example 31, the subject matter of Examples 28-30 can optionally include wherein the plurality of antenna elements comprise a phased array antenna.

What is claimed is:

1. An electronic device for generating or receiving signals comprising:
   a first set of substrate layers comprising a first material;
   a signal generating/receiving circuit embedded in the first set of substrate layers;
   a second set of substrate layers coupled to the first set of substrate layers, the second set of substrate layers comprising a second material having a lower electrical loss than the first material, the second set of substrate layers further comprising a plurality of antenna elements coupled through vias to the signal generating/receiving circuit;
   a first ground plane that couples the first set of substrate layers to the second set of substrate layers, and
   a second ground plane in the second set of substrate layers and separated from the first ground plane by a plurality of substrate layers that are in the second set of substrate layers, wherein the first and second ground planes are on opposite sides of a routing trace layer between the plurality of substrate layers.

2. The electronic device of claim 1 wherein the first material comprises one of an Ajinomoto Build-up Film (ABF) or an epoxy dielectric material.

3. The electronic device of claim 1 wherein the second material comprises one of a liquid crystal polymer (LCP) or low temperature co-fired ceramic (LTCC).

4. The electronic device of claim 1 wherein only the second set of substrate layers comprises mm-wave substrate material.

5. The electronic device of claim 1 wherein the signal generating/receiving circuit comprises a millimeter-wave radio integrated circuit.

6. The electronic device of claim 5 wherein the signal generating/receiving circuit comprises two or more separate dies.

7. The electronic device of claim 6 wherein the two or more separate dies comprise a radio frequency integrated circuit and a baseband integrated circuit.

8. The electronic device of claim 1 wherein the signal generating/receiving circuit is internally coupled to a substrate layer of the first set of substrate layers.

9. The electronic device of claim 1 wherein the plurality of antenna elements comprise:
   a first layer of antenna elements coupled to the signal generating/receiving circuit through the vias; and
   a second layer of antenna elements separated from the first layer by a substrate layer and capacitively coupled to the first layer of antenna elements.

10. The electronic device of claim 1 wherein the first set of substrate layers is coreless.

11. The electronic device of claim 1, wherein the plurality of antenna elements comprise a phased array antenna.

12. A phased array module comprising:
   a set of lower substrate layers comprising a plurality of substrates of a first material, each substrate separated from an adjacent substrate by a low frequency signal layer and/or power supply layer;
   a radio integrated circuit embedded in a first substrate of the set of lower substrate layers and coupled to the low frequency signal layer and/or the power supply layer through a plurality of vias;
   a set of upper substrate layers coupled to the set of lower substrate layers with a first ground plane, the set of upper substrate layers comprising a plurality of substrates of a second material having a lower electrical loss than the first material, each substrate separated from an adjacent substrate by a high frequency signal layer for conducting signals having a higher frequency than the lower frequency signal layer;

a plurality of layers of antenna elements coupled to the set of upper substrate layers, at least one layer of antenna elements operably coupled to the radio integrated circuit through a plurality of vias; and a second ground plane in the set of upper substrate layers and separated from the first ground plane by at least a routing trace layer between a pair of adjacent upper substrate layers.

13. The phase array module of claim 12 wherein the set of lower substrate layers is separated from the set of upper substrate layers by a ground plane.

14. The phase array module of claim 12 wherein the first substrate is located adjacent to the set of upper substrate layers.

15. The phase array module of claim 14 wherein the set of lower substrate layers is coupled to the set of upper substrate layers by a row of solder balls and the radio integrated circuit is embedded into the first substrate layer adjacent to the row of solder balls.

\* \* \* \* \*